United States Patent
Tornare et al.

(10) Patent No.: US 9,678,135 B2
(45) Date of Patent: Jun. 13, 2017

(54) DEVICE FOR DIAGNOSING THE LOSS OF A CONNECTION BETWEEN AN ELECTRONIC CONTROL MODULE AND A GROUND

(71) Applicants: CONTINENTAL AUTOMOTIVE FRANCE, Toulouse (FR); CONTINENTAL AUTOMOTIVE GmbH, Hannover (DE)

(72) Inventors: Jean-Marc Tornare, Colomiers (FR); Christophe Costes, La Salvetat Saint Gilles (FR); Philippe Laurine, Toulouse (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 235 days.

(21) Appl. No.: 14/310,397

(22) Filed: Jun. 20, 2014

(65) Prior Publication Data

US 2014/0375326 A1 Dec. 25, 2014

(30) Foreign Application Priority Data

Jun. 20, 2013 (FR) ..................................... 13 55856

(51) Int. Cl.
*G01R 31/04* (2006.01)
*G01R 31/00* (2006.01)
*G01R 31/02* (2006.01)

(52) U.S. Cl.
CPC ......... *G01R 31/041* (2013.01); *G01R 31/006* (2013.01); *G01R 31/007* (2013.01); *G01R 31/026* (2013.01)

(58) Field of Classification Search
CPC G01R 31/005–31/007; G01R 31/024–31/026; G01R 31/0041;

(Continued)

(56) References Cited

U.S. PATENT DOCUMENTS 5,166,852 A * 11/1992 Sano ................... H03K 17/0822
340/649
5,508,872 A * 4/1996 Khoo ..................... H02H 5/105
361/42

(Continued)

FOREIGN PATENT DOCUMENTS

EP 0 590 180 A1 4/1994
EP 0590180 * 6/1994

(Continued)

OTHER PUBLICATIONS

English Machine Translation of EP 0590180. Martin Swart, Jun. 4, 1994.*
FR Search Report, dated Mar. 19, 2014, from corresponding FR application.

*Primary Examiner* — Tung X Nguyen
*Assistant Examiner* — Lee Rodak
(74) *Attorney, Agent, or Firm* — Young & Thompson

(57) ABSTRACT

The subject of the present invention is a device for diagnosing the loss of a connection to a ground (M) of an electronic control module (BCM) of a motor vehicle. This device (1) comprises a first branch (B1) connecting the electronic control module (BCM) to the ground(M), a second branch (B2) connecting the electronic control module (BCM) to the ground (M) adapted to receive power currents (I(power)) originating from power equipments (EQP) and comprising unidirectional current-conducting means (D), a diagnostic circuit (CD) connected to the second connecting branch (B2) at the level of a measurement point $(P_M)$ situated between the unidirectional current-conducting means (D) and the ground (M) and defining a voltage (Vdiag) for diagnosing a loss of connection to the ground (M) of the electronic control module (BCM) on the first branch connecting (B1). According to the invention, the second connecting branch (B2) comprises, between the measurement point $(P_m)$ of the diagnostic circuit (CD)and (Continued)

the ground(M), voltage-generating means(Rs, Idiag) adapted to increase the diagnostic voltage (Vdiag) in case of disconnection of the first branch (B1).

19 Claims, 3 Drawing Sheets

(58) Field of Classification Search
 CPC .... G01R 31/008; G01R 31/02; G01R 31/021; G01R 31/18; G01R 31/08; G01R 31/28; G01R 31/2812; G01R 31/10; G01R 31/31901; G01R 31/041; G01R 27/18; G01R 27/02; G01R 27/04; G01R 27/00; G01R 1/06; G01R 1/067; H04B 3/46
 USPC ............... 324/503, 509–512, 522, 523, 525, 324/527–528, 508, 555, 609, 649, 691, 324/713; 702/57, 58, 59, 64
 See application file for complete search history.

(56) References Cited

U.S. PATENT DOCUMENTS

| | | | | |
|---|---|---|---|---|
| 5,587,865 | A * | 12/1996 | Bielig | B60T 8/885 307/10.1 |
| 6,218,740 | B1 * | 4/2001 | Mildice | H01R 31/005 307/10.1 |
| 6,393,571 | B1 | 5/2002 | Huckfeldt et al. | |
| 7,224,561 | B2 | 5/2007 | Ilg et al. | |
| 2006/0016435 | A1 * | 1/2006 | Kirkpatrick | F02D 41/20 123/490 |

FOREIGN PATENT DOCUMENTS

| | | |
|---|---|---|
| EP | 1 134 589 A2 | 9/2001 |
| EP | 1 143 254 A1 | 10/2001 |
| FR | 2 904 695 A1 | 2/2008 |

\* cited by examiner

DEVICE FOR DIAGNOSING THE LOSS OF A CONNECTION BETWEEN AN ELECTRONIC CONTROL MODULE AND A GROUND

FIELD OF THE INVENTION

The present invention relates to the field of electronic control in a motor vehicle and more particularly concerns a device and a method for diagnosing the loss of a connection between an electronic control module and a ground.

BACKGROUND OF THE INVENTION

Conventionally, a motor vehicle includes a main electronic control module (BCM or Body Control Module) for controlling a certain number of items of equipment in the vehicle. Among this equipment mention may be made, for example, of the electrical system for controlling the windows of the vehicle, the electrical control system for the rear view mirrors, the air conditioning system, the vehicle immobilization system, the central locking system etc.

For safety reasons, as shown in FIG. 1, it is known to connect the electronic control module BCM to a ground M, for example, of the vehicle battery, by way of two connecting branches: a first connecting branch B1 of logic impedance ZMI and a second connecting branch B2 of power impedance ZMp.

It is also known to link other equipments to the first connecting branch B1 and to the second connecting branch B2 in order to connect them to the ground M too.

Thus, conventionally, still with reference to FIG. 1, secondary electronic control modules ECUs ("Electronic Control Units"), such as, for example, the dashboard, an electronic door module, etc., are linked to the ground M by the first connecting branch B1 at the level of a control point PC.

Similarly, power equipments of the vehicle EQP, for example a windscreen wiper, are linked to the ground M via the second connecting branch B2 at the level of a power point Pp. Such power equipments EQP can, for example, be equipments of the vehicle engine.

To avoid damaging the electronic control module BCM, it is known to arrange on the second connecting branch B2, between the electronic control module BCM and the power point Pp of the power equipments EQP, a unidirectional current-conducting means of the diode D1 type so that the strong currents I(power) flowing from the power equipments EQP toward the ground M do not travel back up along the second connecting branch B2 to the electronic control module BCM.

In order to preserve the electronic components of the electronic control module BCM, it is known to diagnose the loss of connection of the first branch B1 between the electronic control module BCM and the ground M. Such a diagnosis is performed by a diagnostic circuit CD linked to the second connecting branch B2 at the level of the power point $P_P$ of the power equipments EQP. Indeed, when a loss of connection to the ground occurs on the first connecting branch B1, the current originating from the electronic control module BCM no longer passes through the first connecting branch B1 but passes entirely through the second connecting branch B2 through the diode D1. The loss of connection between the electronic control module BCM and the ground M on the first connecting branch B1 is therefore diagnosed by measuring the voltage difference on the second connecting branch B2.

To do this, as illustrated in FIG. 1, the diagnostic circuit CD includes a first resistor R1 assembled in series with a second resistor R2 connected to a direct current power supply $V_N$, for example 5 V, and a microcontroller (not represented), the input of which is linked to a diagnostic point $P_{diag}$ situated between the first resistor R1 and the second resistor R2 and which defines an input voltage Vdiag. The first resistor R1 and the second resistor R2 constitute what is known as a "voltage divider".

When the first connecting branch B1 is connected to the ground M, the diagnostic voltage Vdiag(CONN) is given by the formula:

$$Vdiag(CONN) = V_N \times \frac{R1}{R1+R2} - ZMI \times (I(ECUs) + I(BCM)) \times \frac{R2}{R1+R2} \quad (1)$$

When the first connecting branch B1 is disconnected from the ground M at the level of a disconnection DIS as illustrated in FIG. 2, the diagnostic voltage Vdiag(DISCONN) is given by the formula:

$$Vdiag(DISCONN) = V_N \times \frac{R1}{R1+R2} - UD1 \times \frac{R2}{R1+R2} \quad (2)$$

where UD1 is the voltage defined across the terminals of the diode D1.

The microcontroller periodically measures the input voltage Vdiag and compares it to a threshold. When the input voltage Vdiag is above the threshold, the connection via the first branch B1 of the electronic control module BCM to the ground M is performed. When the input voltage Vdiag is below the threshold, the microcontroller diagnoses a loss of connection to the ground of the electronic control module BCM on the first branch B1.

A problem is raised if the value of the input voltage when the first branch B1 is connected Vdiag(CONN) given by equation (1) and the value of the input voltage when the first branch B1 is disconnected Vdiag(DISCONN) given by equation (2) are both very close to the threshold, i.e. when their difference is not sufficiently large for the microcontroller to be able to diagnose the loss of connection to the ground M of the electronic control module BCM on the first connecting branch B1, when the latter has indeed taken place. Such a diagnostic error leads to a lack of reliability of the device, which is a significant drawback.

This scenario occurs for current ranges of values of the voltage UD1 across the terminals of the diode D1, of the first resistor R1, of the second resistor R2 and of the currents I(BCM) and I(ECUs) flowing through the first connecting branch B1 originating from the main electronic control module BCM and/or the secondary electronic control units ECUs respectively.

Thus, for example, for conventional values of:

$\frac{R2}{R1+R2} = 0.75$, $UD1 = 0.1$ V, $ZMI = 0.3$ Ohms, $I(BCM) = 0.1$ A, $I(ECUs) = 0.2$ A, we have:

$$ZMI \times (I(ECUs) + I(BCM)) \times \frac{R2}{R1 + R2} = 0.07 \text{ V}$$

and $$UD1 \times \frac{R2}{R1 + R2} = 0.075 \text{ V}.$$

In this case, the values of Vdiag(CONN) and Vdiag(DISCONN) are so close to each other that the microcontroller cannot determine with certainty if the value of the input voltage Vdiag measured is above or below the threshold, which leads to frequent diagnostic errors.

SUMMARY OF THE INVENTION

The aim of the present invention is to remedy these drawbacks by proposing a simple and reliable solution for diagnosing a loss of connection of the first branch linking the electronic control module to the ground.

For this purpose, the invention relates to a device for diagnosing the loss of a connection to a ground of an electronic control module of a motor vehicle, said device comprising:
- a first branch connecting the electronic control module to the ground, said first connecting branch being adapted to receive control currents,
- a second branch connecting the electronic control module to the ground, said second connecting branch being adapted to receive power currents originating from power equipments and comprising unidirectional current-conducting means arranged to block said power currents, and,
- a diagnostic circuit connected to the second connecting branch at the level of a measurement point situated between the unidirectional current-conducting means and the ground and defining a voltage for diagnosing a loss of connection to the ground of the electronic control module on the first connecting branch, the device being noteworthy in that the second connecting branch comprises, between the measurement point of the diagnostic circuit and the ground, voltage-generating means adapted to increase the diagnostic voltage in case of disconnection of the first connecting branch.

The term "control currents" is understood to mean currents of low intensities, for example below 7A, from the electronic control module and/or secondary electronic control units. The term "power currents" is understood to mean currents of high intensities, for example above 250A, originating from power equipments of the engine type.

The device according to the invention therefore makes it possible to increase the voltage on the second connecting branch in order to increase the voltage difference measured at the measurement point when the first connecting branch is connected to the ground and when the first connecting branch is disconnected from the ground respectively. In other words, the voltage-generating means on the second branch make it possible to define a new threshold from which the measured voltage value is sufficiently distant, above when the first connecting branch is connected to the ground or below when the first connecting branch is disconnected from the ground. The diagnostic of loss of connection to the ground is therefore advantageously both simple and reliable.

Preferably, the voltage-generating means comprise a diagnostic resistor assembled in series between the measurement point of the diagnositic circuit and the ground and a current generator linked to the second connecting branch at the level of the measurement point. A resistor and a current generator are cheap means for increasing the diagnostic voltage in the event of disconnection of the first connecting branch.

According to an aspect of the invention, the unidirectional current-conducting means appear in the form of a plurality of Schottky diodes assembled in parallel, diodes making it possible to withstand currents of high value, for example above or equal to 7A.

Preferably, the device furthermore comprises a microcontroller adapted to measure the diagnostic voltage and to determine, on the basis of said measured voltage, a loss of connection between the electronic control module and the ground on the first connecting branch.

Advantageously, the electronic control module comprises said microcontroller, which makes it possible to simplify the architecture of the device.

The device can be linked to at least one item of power equipment of the vehicle at the level of a power point of the second connecting branch.

In the same way, the device can be linked to at least one secondary electronic control unit of the vehicle at the level of a control point of the first connecting branch.

The invention also concerns a vehicle, particularly a motor vehicle, comprising an electronic control module and a device as shown previously.

The invention also concerns a method for diagnosing, by way of a diagnostic device, the loss of a connection to a ground of an electronic control module of a motor vehicle, said device comprising:
- a first branch connecting the electronic control module to the ground, said first connecting branch being adapted to receive control currents,
- a second branch connecting the electronic control module to the ground, said second connecting branch being adapted to receive power currents originating from power equipments and comprising unidirectional current-conducting means arranged to block said power currents, and,
- a diagnostic circuit connected to the second connecting branch at the level of a measurement point situated between the unidirectional current-conducting means and the ground and defining a voltage for diagnosing a loss of connection to the ground of the electronic control module on the first connecting branch, the method being noteworthy in that it comprises a step of generating, between the measurement point of the diagnostic circuit and the ground, a voltage adapted to increase the diagnostic voltage in case of disconnection of the first connecting branch.

BRIEF DESCRIPTION OF THE DRAWINGS

Other features and advantages of the invention will become apparent in the following description, made with reference to the appended figures given by way of non-limiting examples and in which identical reference numbers are given to similar objects.

DETAILED DESCRIPTION OF THE INVENTION

The invention is described below for its application in a motor vehicle (not represented) but it goes without saying that it can be applicable to any type of vehicle.

The vehicle comprises a main electronic control module (BCM or "Body Control Module") of a certain number of items of equipment in the vehicle. Among these equipments mention may be made, for example, of the electrical control system for the windows of the vehicle, the electrical control system for the rear view mirrors, the air conditioning system, the vehicle immobilization system, the central locking system etc. Such a module is also known by the name of electronic control unit (or ECU).

The electronic control module BCM is linked to a ground M, for example of the vehicle battery, by way of a first connecting branch B1, called "electronic ground branch" which is the main connection of the module BCM to the ground M, and a second connecting branch B2 called "power ground branch" which is the secondary connection of the module BCM to the ground M. Such redundancy makes it possible to secure the electronic components of the electronic control module BCM in the event of loss of the connection of the module BCM to the ground M on the first branch or main branch B1.

Figure 3:
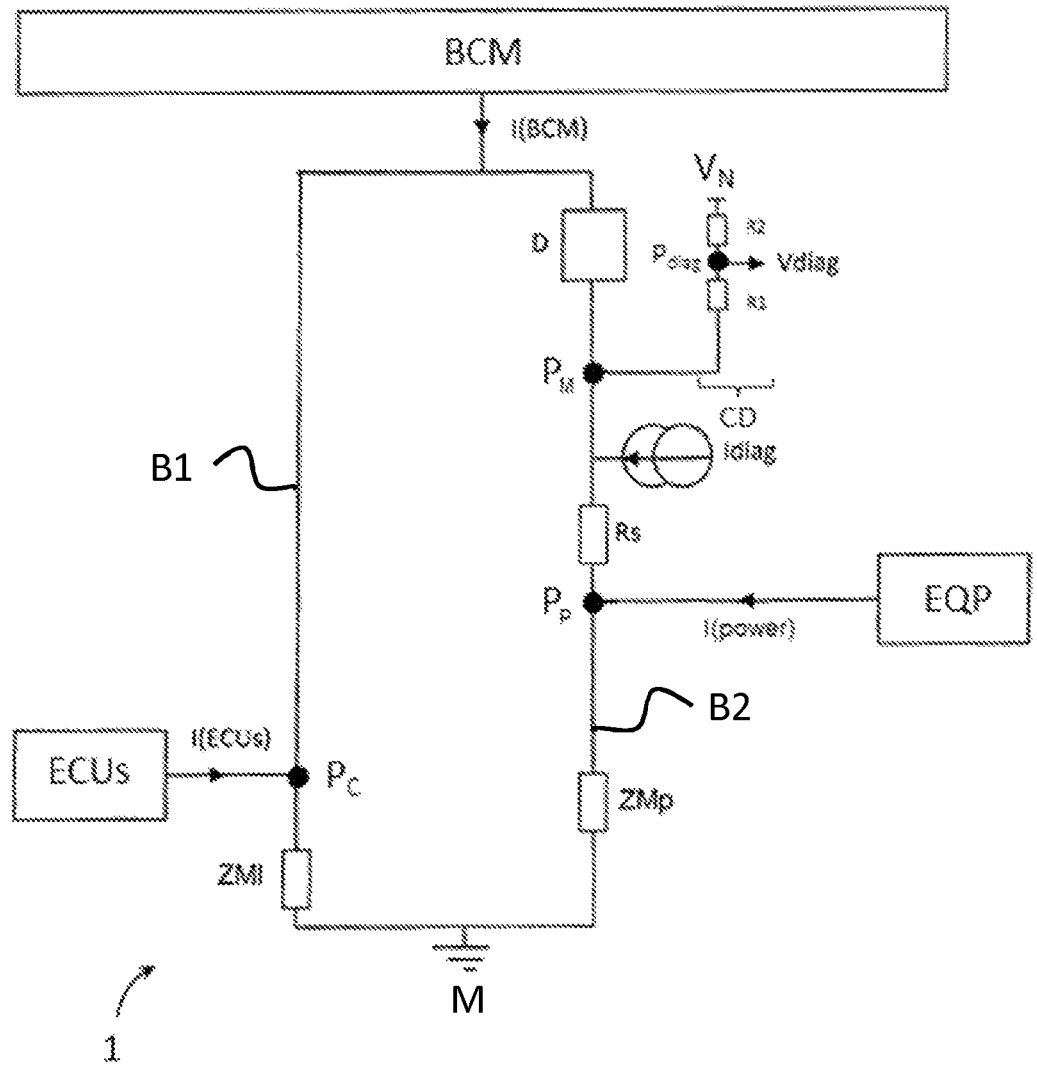
FIG. 3 illustrates a device for diagnosing the loss of a connection to the ground of an electronic control module according to the invention.

In the example illustrated in FIG. 3, the vehicle comprises one or more electronic control units ECUs adapted, for example, for a dashboard, an electronic door module, etc. The vehicle also comprises one or more Items of power equipment EQP, such as, for example, a windscreen wiper.

In order to connect them to the ground, the electronic control unit(s) ECUs is/are linked at the level of a control point $P_c$, to the first connecting branch B1 which is therefore adapted to receive control currents I(BCM) originating from the control module and/or the control currents I(ECUs) originating from the electronic control unit(s) ECUs.

In the same way, in order to connect them to the ground, the item(s) of power equipment EQP are linked, at the level of a control point Pp, to the second connecting branch B2 which is therefore adapted to receive power currents I(power) originating from the item(s) of power equipment EQP.

In order to prevent damage to the electronic control module BCM, the second connecting branch B2 comprises unidirectional current-conducting means D arranged to block the power currents I(power) originating from the power equipments EQP and avoid them returning along the second connecting branch B2 up to the electronic control module BCM.

The unidirectional current-conducting means D can appear in the form of a single diode, for example of standard type or Schottky types. Preferably, the unidirectional current-conducting means D appear in the form of a plurality of Schottky. diodes assembled in parallel.

Finally, the vehicle according to the invention comprises a microcontroller, preferably a microcontroller of the electronic control module BCM, adapted to perform a diagnostic of the loss of connection to the ground of the electronic control module BCM as described below. More precisely, the microcontroller is adapted to measure a diagnostic voltage Vdiag and to determine, on the basis of said measured voltage, a loss of connection between the electronic control module BCM and the ground M.

The device according to the invention makes it possible to diagnose a loss of connection of the electronic control module BCM to the ground M.

With reference to FIG. 3, the device 1 comprises the first connecting branch 61, the second connecting branch B2 and a diagnostic circuit CD connected to the second connecting branch B2 at the level of a measurement point $P_M$ situated between the unidirectional current-conducting means D and the ground M.

The diagnostic circuit CD comprises a first resistor R1 assembled in series with a second resistor R2 connected to a direct current power supply $V_N$ of 5 V.

The diagnostic voltage Vdiag is defined at the level of a diagnostic point Pdiag situated between the first resistor R1 and the second resistor R2.

According to the invention, the second connecting branch B2 of the device 1 comprises, between the diagnostic point Pdiag of the diagnostic circuit CD and the ground M, voltage-generating means adapted to increase the diagnostic voltage Vdiag in case of disconnection of the first connecting branch B1.

In this example, the voltage-generating means appear in the form of a diagnostic resistor Rs, assembled in series on the second connecting branch B2 between the measurement point $P_M$ and the power point $P_P$, and a current generator Idiag linked to the second connecting branch B2 at the level of the measurement point $P_M$.

With the device according to the invention, when the first connecting branch B1 is connected to the ground M, the diagnostic voltage is given by the formula:

$$Vdiag(CONN) = V_N \times \frac{R1}{R1+R2} - \qquad (3)$$
$$ZMl \times (I(ECUs) + I(BCM)) \times \frac{R2}{R1+R2} + (ZMp + Rs) \times Idiag$$

Figure 1:
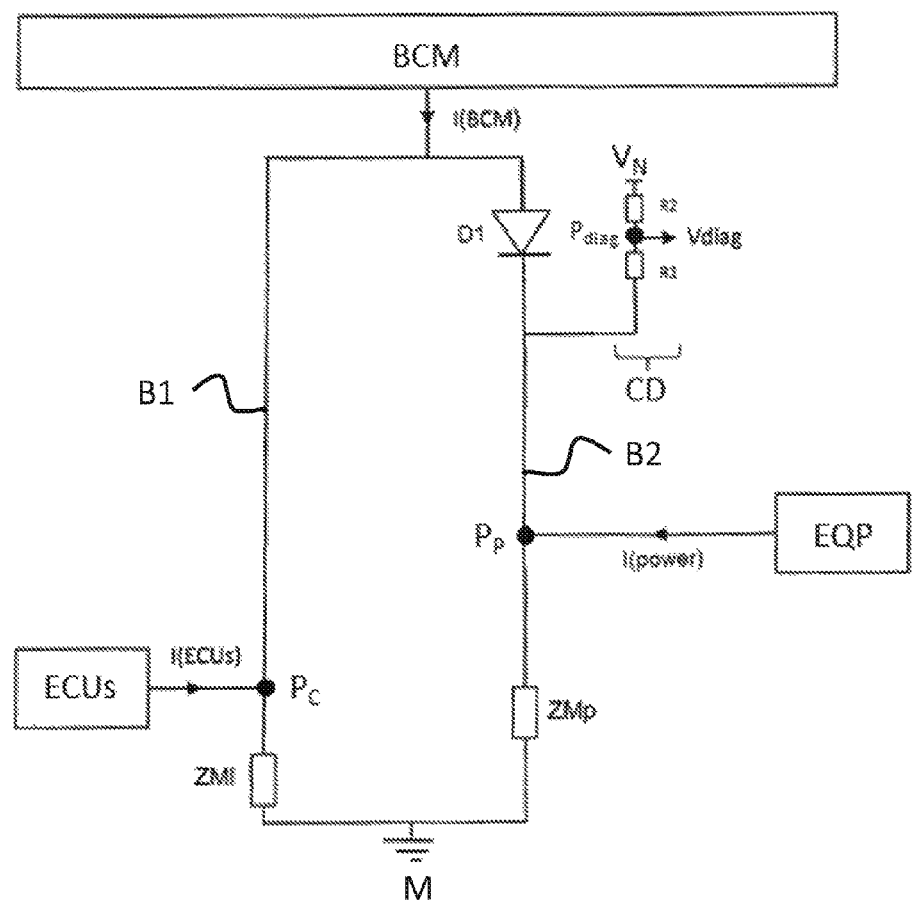
FIG. 1 illustrates a device for diagnosing the loss of a connection to the ground of an electronic control module of the prior art.
Figure 2:
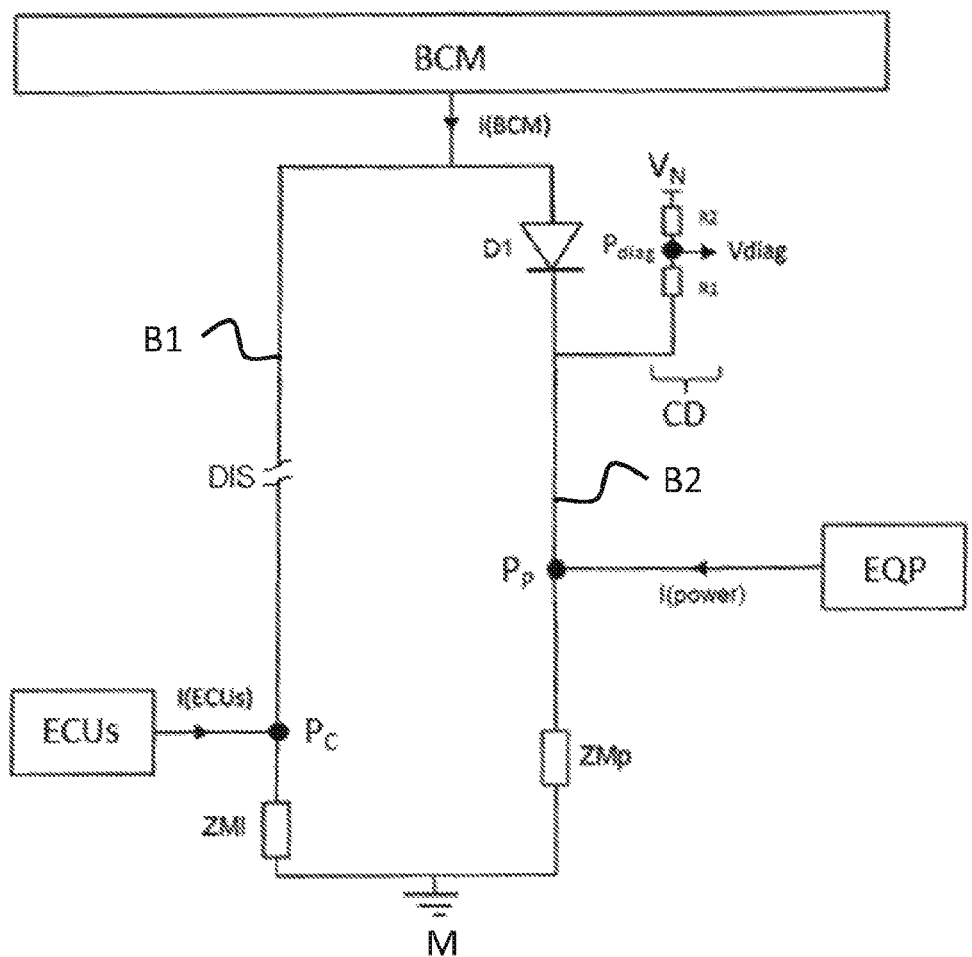
FIG. 2 illustrates the device in FIG. 1 in which the first connecting branch is disconnected from the ground.

When the first connecting branch B1 is disconnected from the ground M at the level of a disconnection DIS as illustrated in FIG. 2, the diagnostic voltage is given by the formula:

$$Vdiag(DISCONN) = V_N \times \frac{R1}{R1+R2} - UD \times \frac{R2}{R1+R2} \qquad (4)$$

where UD is the voltage defined across the terminals of the unidirectional current-conducting means D, similar to equation (2) of the prior art.

The difference ΔVdiag between the voltage value measured when the first connecting branch B1 is connected and the voltage value measured when the first connecting branch B1 is disconnected is given by:

$$\Delta Vdiag(CONN, DISCONN) = (ZMp + Rs) \times Idiag - \qquad (5)$$
$$ZMl \times (I(ECUs) + I(BCM)) \times \frac{R2}{R1+R2} + UD \times \frac{R2}{R1+R2}$$

Thus, even when $$UD \times \frac{R2}{R1+R2}$$

is about equal to $$ZMI \times (I(ECUs) + I(BCM)) \times \frac{R2}{R1+R2},$$

the difference is not zero and is equal to the voltage (ZMp+Rs)×Idiag generated by the current generator Idiag and the diagnostic resistor Rs arranged in series with the impedance ZMp on the second connecting branch B2. The value of the input voltage when the first branch B1 is connected Vdiag(CONN) given by equation (3) and the value of the input voltage when the first branch B1 is disconnected Vdiag(DISCONN) given by equation (4) are therefore sufficiently distant that the microcontroller can determine without diagnostic error whether or not the electronic control module BCM is connected to the ground M by the first connecting branch B1.

Preferably, the values of Idiag and Rs are chosen such that:

(ZMp+Rs)×Idiag>ZMI×(I(ECUs)+I(BCM)).

In that case, it is then possible to directly measure the measurement voltage $T_M$ at the measurement point $P_M$. When the first branch is connected to the ground M, the voltage $T_M$ is positive. When the first branch is disconnected from the ground M, the voltage $T_M$ is negative. In this case, the diagnostic circuit CD can appear in the form of a single wire linking the measurement point $P_M$ to the microcontroller and we then have Vdiag=$T_M$. The microcontroller can thus easily and reliably diagnose the loss of connection to the ground M of the electronic control module BCM on the first connecting branch B1.

The invention claimed is:

1. A device for diagnosing the loss of a connection to a ground (M) of an electronic control module (BCM) of a motor vehicle, said device (1) comprising:
    a first branch (B1) connecting the electronic control module (BCM) to the ground (M), said first connecting branch (B1) being adapted to receive control currents (I(BCM), I(ECUs)),
    a second branch (B2) connecting the electronic control module (BCM) to the ground (M), said second connecting branch (B2) being adapted to receive power currents (I(power)) originating from power equipments (EQP) and comprising unidirectional current-conducting means (D) arranged to block said power currents (I(power)), and
    a diagnostic circuit (CD) connected to the second connecting branch (B2) at the level of a measurement point ($P_M$) situated between the unidirectional current-conducting means (D) and the ground (M) and defining a voltage (Vdiag) for diagnosing a loss of connection to the ground (M) of the electronic control module (BCM) on the first connecting branch (B1),
        wherein the second connecting branch (B2) comprises, between the measurement point ($P_M$) of the diagnostic circuit (CD) and the ground (M), voltage-generating means (Rs, Idiag) adapted to increase the diagnostic voltage (Vdiag) in case of disconnection of the first connecting branch (B1).

2. The device according to claim 1, in which the voltage-generating means comprise a diagnostic resistor (Rs) assembled in series between the measurement point ($P_M$) of the diagnostic circuit (CD) and the ground (M) and a current generator (Idiag) linked to the second connecting branch (B2) at the level of the measurement point (PM).

3. The device according to claim 1, in which the unidirectional current-conducting means (D) appear in the form of a plurality of Schottky diodes assembled in parallel.

4. The device according to claim 1, said device (1) furthermore comprising a microcontroller adapted to measure the diagnostic voltage and to determine, on the basis of said measured voltage, a loss of connection between the electronic control module (BCM) and the ground (M) on the first connecting branch (B1).

5. The device according to claim 1, said device being linked to at least one item of power equipment (EQP) of the vehicle at the level of a power point ($P_P$) of the second connecting branch (B2).

6. The device according to claim 1, said device being linked to at least one secondary electronic control unit (ECUs) of the vehicle at the level of a control point ($P_C$) of the first connecting branch (B1).

7. A vehicle, including a motor vehicle, comprising an electronic control module (BCM) and a device (1) according to claim 1.

8. The vehicle according to claim 7, in which the electronic control module (BCM) comprises said microcontroller.

9. The device according to claim 1, wherein,
    the voltage-generating means (Rs, Idiag) comprises
    i) a diagnostic resistor (Rs) assembled in series between the measurement point (PM) of the diagnostic circuit (CD) and the ground (M) and
    ii) a current generator (Idiag) linked to the second connecting branch (B2) at the level of the measurement point (PM),
    the unidirectional current-conducting means (D) comprises a plurality of Schottky diodes assembled in parallel,
    said device is linked to at least one item of power equipment (EQP) of the vehicle at the level of a power point (PP) of the second connecting branch (B2),
    said device is linked to at least one secondary electronic control unit (ECUs) of the vehicle at the level of a control point (PC) of the first connecting branch (B1), and
    further comprising a microcontroller adapted to measure the diagnostic voltage and to determine, on the basis of said measured voltage, a loss of connection between the electronic control module (BCM) and the ground (M) on the first connecting branch (B1).

10. The device according to claim 1, wherein, the first branch (B1) connecting the electronic control module (BCM) to the ground (M) is free of any diode.

11. The device according to claim 1, wherein, the diagnostic circuit (CD) includes voltage divider the connected to a direct current power supply (V), the voltage divider defining the voltage (Vdiag) for diagnosing a loss of connection to the ground (M) of the electronic control module (BCM) on the first connecting branch (B1).

12. The device according to claim 1, wherein, the voltage-generating means (Rs, Idiag) comprises
    i) a diagnostic resistor (Rs) assembled in series between the measurement point (PM) of the diagnostic circuit (CD) and the ground (M) and ii) a current generator (Idiag) linked to the second connecting branch (B2) at the level of the measurement point (PM), and the diagnostic circuit (CD) includes voltage divider comprised of a first resistor (R1) connected in series with a second resistor (R2), the first resistor (R1) located on a first side of a diagnostic point ($P_{diag}$) of the voltage (Vdiag) for diagnosing the loss of connection to the ground (M) of the electronic control module (BCM) on the first connecting branch (B1) and the second resistor (R2) located on an opposite, second side of the diagnostic point (Pdiag) of the voltage (Vdiag) for diagnosing the loss of connection to the ground (M) of the electronic control module (BCM) on the first connecting branch (B1), the second resistor (R2) being connected to a direct current power supply (V).

13. The device according to claim 12, wherein, the unidirectional current-conducting means (D) comprises a plurality of Schottky diodes assembled in parallel, said device being is linked to at least one item of power equipment (EQP) of the vehicle at the level of a power point (PP) of the second connecting branch (B2), said device being is linked to at least one secondary electronic control unit (ECUs) of the vehicle at the level of a control point (PC) of the first connecting branch (B1), and further comprising a microcontroller adapted to measure the diagnostic voltage and to determine, on the basis of said measured voltage, a loss of connection between the electronic control module (BCM) and the ground (M) on the first connecting branch (B1).

14. The device according to claim 12, wherein the first and second connecting branch are connected in parallel between the electronic control module (BCM) and the ground (M).

15. The device according to claim 12, wherein, the unidirectional current-conducting means (D) comprises at least one diode, said device being is linked to at least one item of power equipment (EQP) of the vehicle at the level of a power point (PP) of the second connecting branch (B2), said device being is linked to at least one secondary electronic control unit (ECUs) of the vehicle at the level of a control point (PC) of the first connecting branch (B1), and further comprising a microcontroller adapted to measure the diagnostic voltage and to determine, on the basis of said measured voltage, a loss of connection between the electronic control module (BCM) and the ground (M) on the first connecting branch (B1).

16. The device according to claim 1, wherein, the voltage-generating means (Rs, Idiag) comprises i) a diagnostic resistor (Rs) located in series between the measurement point (PM) of the diagnostic circuit (CD) and the ground (M) and ii) a current generator (Idiag) linked to the second connecting branch (B2) at the measurement point (PM), and the diagnostic circuit (CD) comprises a voltage divider positioned across a diagnostic point ($P_{diag}$) of the voltage (Vdiag) for diagnosing the loss of connection to the ground (M) of the electronic control module (BCM) on the first connecting branch (B1), a first end of the voltage divider being connected to the second power ground branch (B2) at the measurement point (PM) situated between the unidirectional current-conducting means (D) and the ground (M) and a second end of the voltage divider being connected to a direct current power supply (V).

17. A method for diagnosing, by way of a diagnostic device (1), the loss of a connection to a ground of an electronic control module of a motor vehicle, said device (1) comprising:

a first branch (B1) connecting the electronic control module (BCM) to the ground (M), said first connecting branch (B1) being adapted to receive control currents (I(BCM), I(ECUs)), a second branch (B2) connecting the electronic control module (BCM) to the ground (M), said second connecting branch (B2) being adapted to receive power currents (I(power)) originating from power equipments (EQP) and comprising unidirectional current-conducting means (D) arranged to block said power currents (I(power)), and, a diagnostic circuit (CD) connected to the second connecting branch (B2) at the level of a measurement point ($P_M$) situated between the unidirectional current-conducting means (D) and the ground (M) and defining a voltage (Vdiag) for diagnosing a loss of connection to the ground (M) of the electronic control module (BCM) on the first connecting branch (B1), the method comprising a step of generating, between the measurement point ($P_M$) of the diagnostic circuit (CD) and the ground (M), a voltage (Rs, Idiag) adapted to increase the diagnostic voltage (Vdiag) in case of disconnection of the first connecting branch (B1).

18. A device for diagnosing the loss of a connection to a ground (M) of an electronic control module (BCM) of a motor vehicle, said device (1) comprising:

a first electronic ground branch (B1) connecting the electronic control module (BCM) to the ground (M), said first electronic ground branch (B1) being adapted to receive control currents (I(BCM), I(ECUs));

a second power ground branch (B2) connecting the electronic control module (BCM) to the ground (M), said second power ground branch (B2) being adapted to receive power currents (I(power)) originating from power equipments (EQP) and comprising unidirectional current-conducting element (D) that blocks said power currents (I(power)); and a diagnostic circuit (CD) connected to the second power ground branch (B2) at a measurement point ($P_M$) situated between the unidirectional current-conducting means (D) and the ground (M), the diagnostic circuit (CD) defining a voltage (Vdiag) for diagnosing a loss of connection to the ground (M) of the electronic control module (BCM) on the first electronic ground branch (B1), wherein, the second power ground branch (B2) comprises a voltage-generating means (Rs, Idiag) located between the measurement point ($P_M$) of the diagnostic circuit (CD) and the ground (M), the voltage-generating unit (Rs, Idiag) adapted to increase the diagnostic voltage (Vdiag) upon disconnection of the first electronic ground branch (B1), the voltage-generating unit (Rs, Idiag) comprising i) a diagnostic resistor (Rs) located in series between the measurement point ($P_M$) of the diagnostic circuit (CD) and the ground (M) and ii) a current generator (Idiag) linked to the second power ground branch (B2) at the measurement point ($P_M$), and the diagnostic circuit (CD) comprising a voltage divider positioned across a diagnostic point ($P_{diag}$) of the voltage (Vdiag) for diagnosing the loss of connection to the ground (M) of the electronic control module (BCM) on the first electronic ground branch (B1), a first end of the voltage divider being connected to the second power ground branch (B2) at a measurement point (PM) situated between the unidirectional current-conducting means (D) and the ground (M) and a second end of the voltage divider being connected to a direct current power supply (V).

19. The device according to claim 18, wherein,
the voltage divider is comprised of a first resistor (R1) connected in series with a second resistor (R2), the first resistor (R1) located on a first side of the diagnostic point (Pdiag) of the voltage (Vdiag) and the second resistor (R2) located on an opposite, second side of the diagnostic point (Pdiag), the second resistor (R2) being connected to the direct current power supply(V).

\* \* \* \* \*

UNITED STATES PATENT AND TRADEMARK OFFICE
CERTIFICATE OF CORRECTION

PATENT NO. : 9,678,135 B2  
APPLICATION NO. : 14/310397  
DATED : June 13, 2017  
INVENTOR(S) : Jean-Marc Tornare, Christophe Costes and Philippe Laurine Page 1 of 1

It is certified that error appears in the above-identified patent and that said Letters Patent is hereby corrected as shown below:

In the Claims

Column 9, Line 21, 24, 40 and 43:
"said device being is linked"
Should be replaced with:
-- said device being linked --

Signed and Sealed this
Third Day of October, 2017

Joseph Matal
*Performing the Functions and Duties of the*
*Under Secretary of Commerce for Intellectual Property and*
*Director of the United States Patent and Trademark Office*